(12) United States Patent
Ono

(10) Patent No.: US 9,929,228 B2
(45) Date of Patent: Mar. 27, 2018

(54) DISPLAY DEVICE

(71) Applicant: JOLED INC., Tokyo (JP)

(72) Inventor: Shinya Ono, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/320,998

(22) PCT Filed: Jun. 24, 2015

(86) PCT No.: PCT/JP2015/003186
§ 371 (c)(1),
(2) Date: Dec. 21, 2016

(87) PCT Pub. No.: WO2015/198605
PCT Pub. Date: Dec. 30, 2015

(65) Prior Publication Data
US 2017/0154946 A1    Jun. 1, 2017

(30) Foreign Application Priority Data

Jun. 26, 2014  (JP) .................................. 2014-131917

(51) Int. Cl.
*H01L 27/32* (2006.01)
*G09G 3/3258* (2016.01)
(Continued)

(52) U.S. Cl.
CPC ....... *H01L 27/3279* (2013.01); *G09G 3/3258* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 51/5206* (2013.01); *H01L 51/5221* (2013.01); *G09G 2300/0426* (2013.01);
(Continued)

(58) Field of Classification Search
None
See application file for complete search history.

(56) References Cited

U.S. PATENT DOCUMENTS

2002/0158835 A1* 10/2002 Kobayashi .......... H01L 27/3244
345/100

FOREIGN PATENT DOCUMENTS

JP          2002-318556        10/2002

OTHER PUBLICATIONS

International Search Report (ISR) in International Pat. Appl. No. PCT/JP2015/003186, dated Sep. 8, 2015.

* cited by examiner

*Primary Examiner* — Kenneth B Lee, Jr.
(74) *Attorney, Agent, or Firm* — Greenblum & Bernstein, P.L.C.

(57) ABSTRACT

A display device includes: a display unit in which a plurality of pixels are arranged; and a power supply unit configured to feed a power supply voltage to the pixels through a power feeding line disposed on an outer periphery of the display unit. The pixels each include: an anode formed on a drive circuit layer; an auxiliary wire formed on the drive circuit layer to be spaced apart from the anode; an organic light emitting layer and an electron transport layer that are formed above the anode; and a transparent cathode formed above the electron transport layer. The electron transport layer and the transparent cathode extend from above the anode to above the auxiliary wire. The electron transport layer has a resistance value $R_{ip}$ that satisfies the following relationship: $R_{ip} \leq (R_{2p} - R_{bp}) \times M \times (M+1)/2$.

8 Claims, 6 Drawing Sheets

(51) Int. Cl.
*H01L 51/52* (2006.01)
*H01L 51/50* (2006.01)
(52) U.S. Cl.
CPC . *G09G 2320/0233* (2013.01); *G09G 2330/02* (2013.01)

DISPLAY DEVICE

TECHNICAL FIELD

The present disclosure relates to a display device, and more particularly to a display device in which brightness nonuniformity is reduced.

BACKGROUND ART

In recent years, attention has been paid to an active matrix display device including an organic electroluminescent element (hereinafter referred to as "organic EL element") that is self-emissive and has a wide viewing angle and high-speed responsiveness.

The display device includes: a display panel in which an organic EL element is disposed; and a drive circuit that drives the organic EL element. The display panel is configured by disposing organic EL elements in a matrix on a substrate made of glass or the like, each organic EL element including a first electrode made of Al or the like, a second electrode made of ITO (Indium Tin Oxide) or the like that is disposed oppositely to the first electrode, and a light emitting layer provided between the first electrode and the second electrode. The drive circuit is provided between the substrate and the first electrode, and is formed by using a thin film transistor (TFT) that drives an organic EL element, or the like.

Also, study has been conducted on a bottom emission type display device that provides light emitted by the organic EL elements to the outside via the substrate and a top emission type display device that provides light emitted by the organic EL elements from the second electrode side that is disposed oppositely to the substrate. However, in the bottom emission type active matrix display device, the thin film transistor of the drive circuit is formed on the substrate, and it is therefore difficult to ensure a sufficient aperture ratio.

On the other hand, in the top emission type display device, the aperture ratio is not limited by the thin film transistor or the like, and thus the efficiency of utilization of emitted light can be enhanced as compared to the bottom emission type display device. In this case, the top emission type display device provides the light to the outside via the second electrode formed on top of the light emitting layer, and thus the second electrode is required to have a high level of conductivity and a high level of light transmittance. However, in general, a metal oxide such as ITO or a thin film made of a metal such as magnesium, aluminum or silver is used as the transparent conductive material of the second electrode. Metal oxides and thin film metals have a higher resistivity than a metal layer used as a wire or the like. For this reason, a difference occurs in the wire length of the second electrode between light emitting pixels as the display panel is configured to be larger in area, which causes a large voltage drop between the end of the power supply unit and the center of the panel and creating a difference in brightness accordingly, and as a result, the center appears dark. That is, there is a problem in that the brightness varies depending on the position of the organic EL element on the display panel, which causes a deterioration in the quality of display.

In order to avoid this, it is effective to provide, for each pixel, a structure that feeds power from the low resistance wire provided at bottom to the transparent electrode provided on top.

In a display device disclosed in Patent Literature (PTL) 1, a first electrode made of a conductive material having a low resistivity and an auxiliary wire are provided separately on a substrate, a light modulation layer serving as a light emitting layer is provided on the first electrode, and a second electrode made of a transparent conductive material is provided on the light modulation layer. Furthermore, the auxiliary wire and the second electrode are connected via an opening partially formed in a partition wall.

CITATION LIST

Patent Literature

[PTL 1]
Japanese Unexamined Patent Application Publication No. 2002-318556

SUMMARY OF INVENTION

Technical Problem

However, with the display device disclosed in PTL 1, in order to directly connect the auxiliary electrode and the second electrode, it is necessary to form the light emitting layer and a functional layer, which is formed between the light emitting layer and the second electrode, on the first electrode but not on the auxiliary electrode. Along with a trend toward larger and higher resolution screens, the technique for uniformly forming a light emitting layer and a functional layer is sophisticated, and in particular, forming the functional layer so as to define high resolution pixels requires a highly accurate film forming mask and a complicated process, making the production process complicated.

The present invention has been made in view of the problems described above, and it is an object of the present invention to provide a display device in which brightness variations between pixels are reduced with a simplified production process.

Solution to Problem

In order to achieve the above object, a display device according to one aspect of the present invention is a display device including: a display unit in which pixels are arranged in a matrix, the pixels each including a light emitting element, and a circuit element for driving the light emitting element to emit light; and a power supply unit configured to feed a power supply voltage to the pixels through a power feeding line disposed in an outer periphery region of the display unit, wherein the pixels each include: a first electrode formed on a drive circuit substrate on which the circuit element is formed; an auxiliary wire formed on the drive circuit substrate to be spaced apart from the first electrode; a light emitting layer formed above the first electrode, the light emitting layer containing a light emitting substance; a second electrode formed above the light emitting layer; and an intermediate layer provided between the first electrode and the second electrode, the intermediate layer and the second electrode extend from above the first electrode to above the auxiliary wire, and the intermediate layer on the auxiliary wire has a resistance value $R_{ip}$ that satisfies the following relationship: $R_{ip} \leq (R_{2p} - R_{bp}) \times M \times (M+1)/2$, where one of the pixels that is located farthest from the power feeding line is defined as a first pixel disposed in a position corresponding to an Mth pixel from the power feeding line, a resistance value of the second electrode per pixel is represented by $R_{2p}$, and a resistance value of the auxiliary wire per pixel is represented by $R_{bp}$.

Advantageous Effects of Invention

With the display device according to the present invention, the resistance value of the intermediate layer is determined based on the relationship between the resistance value of the second electrode and the resistance value of the auxiliary wire. With this configuration, it is possible to implement a display device having a high quality of display in which the amount of voltage drop in a pixel located farthest from the power feeding line can be reduced, and brightness variations between pixels caused by a voltage drop are reduced significantly by a simplified production process even when the display device is used as a large-format panel.

DESCRIPTION OF EMBODIMENTS

Figure 1:
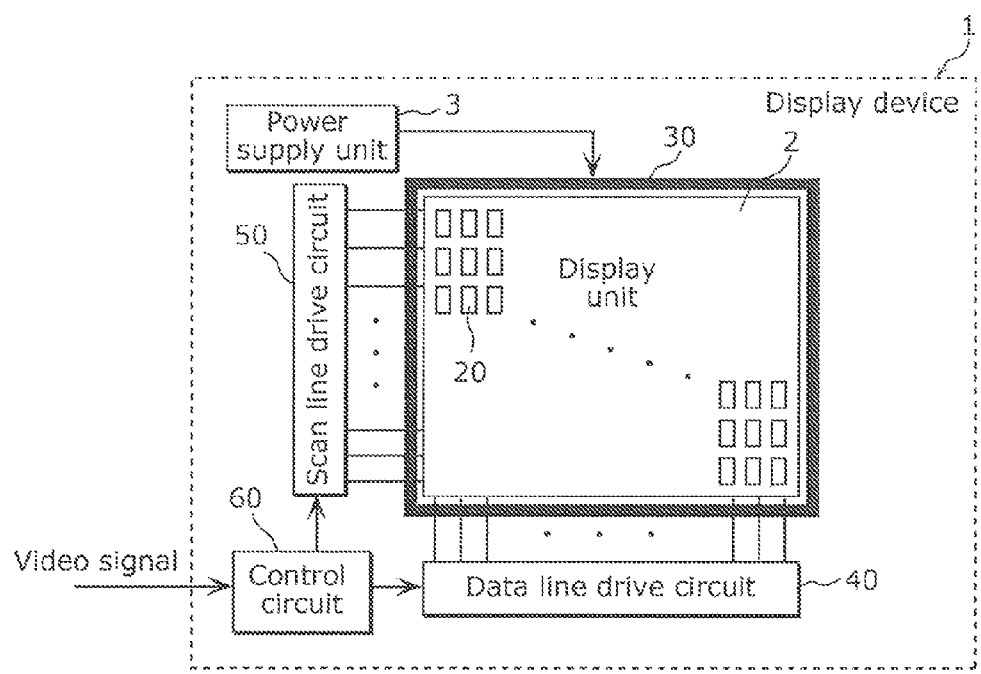
FIG. 1 is a functional block diagram showing an entire configuration of a display device according to Embodiment 1.

Hereinafter, a display device according to one embodiment will be described with reference to the drawings. Note that the embodiment described below shows a preferred specific example of the present disclosure. Accordingly, the numerical values, shapes, materials, structural elements, the arrangement and connection of the structural elements, steps, and the order of the steps, and the like shown in the following embodiment are merely examples, and therefore do not limit the scope of the present invention. Accordingly, among the structural elements described in the following embodiment, structural elements not recited in any one of the independent claims are described as arbitrary structural elements.

In addition, the diagrams are schematic representations, and thus are not necessarily true to scale. Also, in the diagrams, structural elements that are substantially the same are given the same reference numerals, and a redundant description will be omitted or simplified.

Embodiment 1

A display device 1 according to Embodiment 1 will be descried with reference to the drawings.

FIG. 1 is a functional block diagram showing an entire configuration of a display device according to Embodiment 1.

[Overall Configuration of Display Device]

A display device 1 according to the present embodiment includes a display unit 2, a power supply unit 3, a data line drive circuit 40, a scan line drive circuit 50, and a control circuit 60.

The display unit 2 includes pixels 20 that are arranged in a matrix, the pixels 20 each having an organic EL element and a circuit element for driving the organic EL element to emit light.

The power supply unit 3 feeds a power supply voltage to each pixel from a power feeding line 30 disposed in the outer periphery region of the display unit 2. The power feeding line 30 includes a positive voltage power feeding line that transmits a positive power supply voltage and a negative voltage power feeding line that transmits a negative power supply voltage having a potential lower than that of the positive power supply voltage.

The control circuit 60 generates a control signal S4 for controlling the data line drive circuit 40 based on a video signal input from the outside, and outputs the generated control signal S4 to the data line drive circuit 40. Also, the control circuit 60 generates a control signal S5 for controlling the scan line drive circuit 50 based on an input synchronization signal, and outputs the generated control signal S5 to the scan line drive circuit 50.

The data line drive circuit 40 drives data lines of the display unit 2 based on the control signal S4 generated by the control circuit 60. To be more specific, the data line drive circuit 40 outputs a data voltage, in which the video signal is reflected, to each pixel circuit based on the video signal and a horizontal synchronization signal.

The scan line drive circuit 50 drives scan lines of the display unit 2 based on the control signal S5 generated by the control circuit 60. To be more specific, the scan line drive circuit 50 outputs a scan signal or the like to each pixel circuit at least on a display line basis based on a vertical synchronization signal and the horizontal synchronization signal.

[Pixel Structure]

Figure 2:
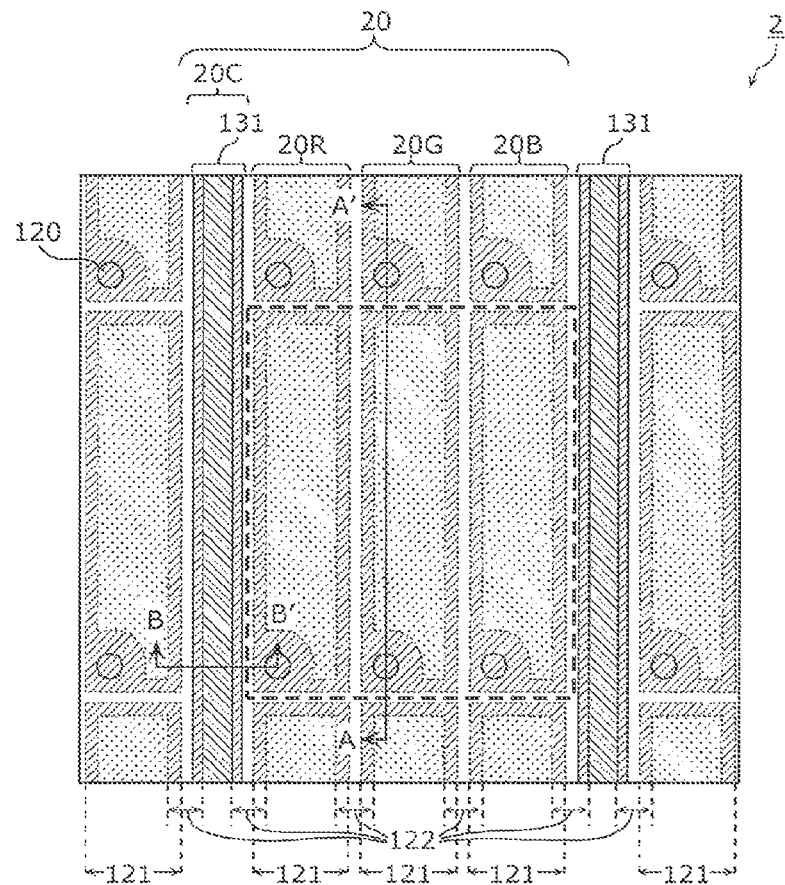
FIG. 2 is a partial plan view illustrating an important part of the display device according to Embodiment 1.
Figure 3:
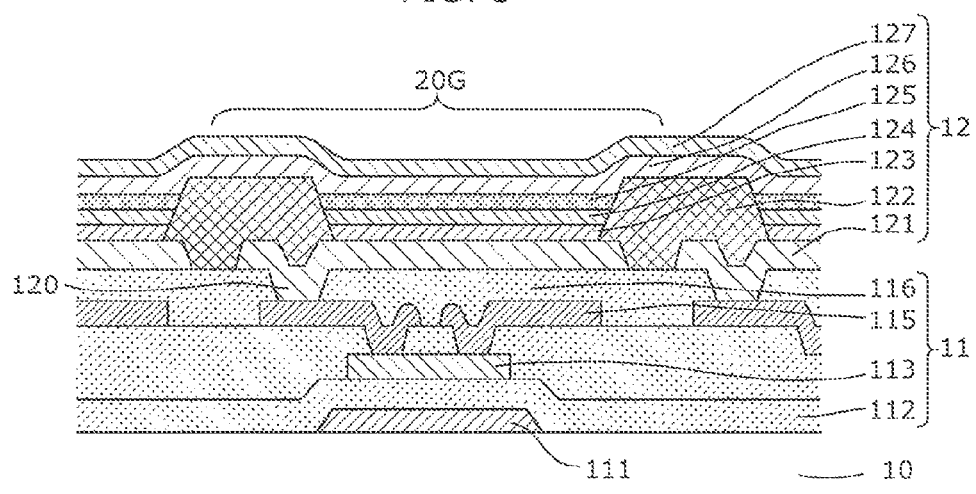
FIG. 3 is a cross-sectional view of the important part taken along the line A-A' shown in FIG. 2.
Figure 4:
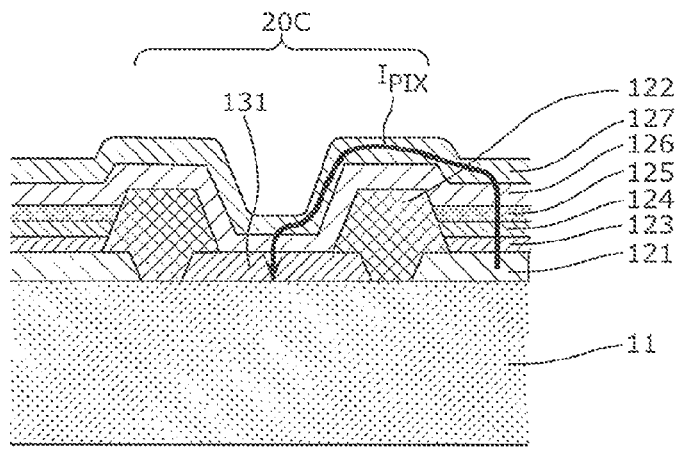
FIG. 4 is a cross-sectional view of the important part taken along the line B-B' shown in FIG. 2.

FIG. 2 is a partial plan view illustrating an important part of the display device according to Embodiment 1. FIG. 3 is a cross-sectional view of the important part taken along the line A-A' shown in FIG. 2, and FIG. 4 is a cross-sectional view of the important part taken along the line B-B' shown in FIG. 2. FIG. 2 shows a part of the display unit including one pixel 20. As shown in FIG. 2, the pixel 20 includes, for example, a sub-pixel 20R for displaying red, a sub-pixel 20G for displaying green, a sub-pixel 20B for displaying blue, and a connecting portion 20C. Also, FIG. 2 shows an anode 121 that is spacedly provided in each sub-pixel, a bank 122 that is provided for each sub-pixel column so as to define sub-pixels, an auxiliary wire 131 that is disposed for each pixel 20, and a via hole 120 that electrically connects a drive circuit layer and the anode 121.

Hereinafter, a stack structure of the pixel 20 will be described with reference to FIGS. 3 and 4. As shown in FIG. 3, the sub-pixel 20G includes a substrate 10, a drive circuit layer 11 provided on the substrate 10, and an organic EL layer 12 provided on the drive circuit layer 11.

The substrate 10 can be, for example, a glass substrate, a quartz substrate or the like. It is also possible to use a plastic substrate made of polyethylene terephthalate or polyethersulfone so as to impart bendability to the display device 1. In particular, in the case of a top emission type display device as in the present embodiment, a non-transparent plastic substrate or a ceramic substrate can be used.

The drive circuit layer 11 is a layer on which a circuit element for driving the organic EL element to emit light is formed. The circuit element can be, for example, a thin film transistor (hereinafter referred to as TFT). The drive circuit layer 11 includes, for example, a gate electrode 111, a gate insulating layer 112, a semiconductor layer 113, a source electrode 114 (not shown in the drawing), a drain electrode 115, an interlayer insulating layer 116, and a via hole 120.

The organic EL layer 12 includes the anode 121, the bank 122, a positive hole injection layer 123, a positive hole transport layer 124, an organic light emitting layer 125, an electron transport layer 126, and a transparent cathode 127.

The anode 121 is a first electrode that is formed on the interlayer insulating layer 116 and is spacedly formed in each sub-pixel. Also, the anode 121 is formed unitarily with the via hole 120 for connecting to the source electrode 114 in the driving transistor. There is no particular limitation on the material of the anode 121 and the via hole 120, and it is preferable to use a material having a small electrical resistivity. For example, it is possible to use: any one of the metals including silver, aluminum, nickel, chromium, molybdenum, copper, iron, platinum, tungsten, lead, tin, antimony, strontium, titanium, manganese, indium, zinc, vanadium, tantalum, niobium, lanthanum, cerium, neodymium, samarium, europium, palladium, copper and cobalt; an alloy made using these metals; or a stack thereof.

The bank 122 is a partition wall that is provided for each sub-pixel column so as to define sub-pixels. The bank 122 can be made by using a resin material such as polyimide resin. At this time, in order to prevent the light generated by the organic light emitting layer 125 from being transmitted to adjacent sub-pixels, for example, carbon particles may be incorporated into the resin.

The positive hole injection layer 123 is formed on the anode 121 and is spacedly formed in each sub-pixel by the bank 122. The positive hole injection layer 123 is a layer composed mainly of a positive hole injecting material. As used herein, the positive hole injecting material is a material that has a function of injecting positive holes injected from the anode 121 side into the organic light emitting layer 125 in a stable manner or while assisting in the generation of positive holes. As the positive hole injection layer 123, for example, PEDOT (polyethylenedioxythiophene) or the like can be used.

The positive hole transport layer 124 is formed on the positive hole injection layer 123 and is spacedly formed in each sub-pixel by the bank 122. The positive hole transport layer 124 has a function of transporting the positive holes injected from the positive hole injection layer 123 to the inside of the organic light emitting layer 125. As the positive hole transport layer 124, a positive hole transporting organic material can be used. As used herein, the positive hole transporting organic material is an organic substance having a property of transmitting generated positive holes by an inter-molecular charge transfer reaction. This is also called a p-type organic semiconductor. The positive hole transport layer 124 may be made of a high molecular material or a low molecular material, but it is preferable that the positive hole transport layer 124 is formed by a wet printing method and contains a cross-linking agent such that it does not easily leach out into the organic light emitting layer 125 when forming the organic light emitting layer 125 that is an overlying layer. There is no particular limitation on the positive hole transporting material, and an aromatic amine can be used. Preferably, a triphenylamine derivative and a triarylamine derivative are used. As the cross-linking agent, for example, dipentaerythritol hexaacrylate and the like can be used.

There is no particular limitation on the method for forming the positive hole transport layer 124, and a nozzle jet method as typified by an inkjet method, or a dispenser method can be used. In this case, the inkjet method is a method for forming the positive hole transport layer 124 by spraying an ink made of an organic film-forming material from a nozzle.

The organic light emitting layer 125 is formed on the positive hole transport layer 124 and is spacedly formed in each sub-pixel by the bank 122. The organic light emitting layer 125 is a layer that emits light by application of voltage between the anode 121 and the transparent cathode 127. The organic light emitting layer 125 may be made of a low molecular organic light emitting material or a high molecular organic light emitting material. As the high molecular light emitting material, for example, a polymer light emitting material such as polyparaphenylenevinylene (PPV) or polyfluorene can be used. As the low molecular light emitting material, in addition to $Alq_3$ and Be-benzoquinolinol (BeBq2), it is also possible to use the following: benzooxazole fluorescent brightening agents such as 2,5-bis(5,7-di-t-pentyl-2-benzoxazolyl)-1,3,4-thiadiazole, 4,4'-bis(5,7-bentyl-2-benzoxazolyl)stilbene, 4,4'-bis[5,7-di-(2-methyl-2-butyl)-2-benzoxazolyl]stilbene, 2,5-bis(5,7-di-t-bentyl-2-benzoxazolyl)thiophine, 2,5-bis([5-o,o-dimethylbenzyl]-2-benzoxazolyl)thiophene, 2,5-bis[5,7-di-(2-methyl-2-butyl)-2-benzoxazolyl]-3,4-diphenylthiophene, 2,5-bis(5-methyl-2-benzoxazolyl)thiophene, 4,4'-bis(2-benzo oxazolyl) biphenyl, 5-methyl-2-[2-[4-(5-methyl-2-benzo oxazolyl) phenyl]vinyl]benzo oxazolyl, 2-[2-(4-chlorophenyl)vinyl] naphtho[1,2-d]oxazole; benzothiazole fluorescent brightening agents such as 2,2'-(p-phenylene divinylene)-bisbenzothiazole; benzo imidazole fluorescent brightening agents such as 2-[2-[4-(2-benzo imidazolyl)phenyl]vinyl] benzoimidazole and 2-[2-(4-carboxyphenyl)vinyl]benzoimidazole; 8-hydroxyquinoline metal complexes such as tris(8-quinolinol)aluminum, bis(8-quinolinol)magnesium, bis(benzo[f]-8-quinolinol)zinc, bis(2-methyl-8-quinolinolato)aluminum oxide, tris(8-quinolinol)indium, tris(5-methyl-8-quinolinol)aluminum, 8-quinolinol lithium, tris(5-chloro-8-quinolinol)gallium, bis(5-chloro-8-quinolinol) calcium, poly[zinc-bis(8-hydroxy 5-quinolinonyl)methane]; metal chelated oxinoid compounds such as dilithium epindolidione; styrylbenzene compounds such as 1,4-bis(2-methylstyryl)benzene, 1,4-(3-methylstyryl)benzene, 1,4-bis (4-methylstyryl)benzene, distyrylbenzene, 1,4-bis(2-ethylstyryl)benzene, 1,4-bis(3-ethylstyryl)benzene and 1,4-bis(2-methylstyryl)2-methylbenzene; distyrylpyrazine derivatives such as 2,5-bis(4-methylstyryl)pyrazine, 2,5-bis (4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine and 2,5-bis[2-(1-pyrenyl)vinyl]pyrazine; naphthalimide derivatives; perylene derivatives; oxadiazole derivatives; aldazine derivatives; cyclopentadiene derivatives; styrylamine derivatives; coumalin derivatives; aromatic dimethylidene derivatives; and the like. Furthermore, anthracene, salicylate, pyrene, coronene and the like can also be used. Alternatively, it is also possible to use a phosphorescent emitter material such as fac-tris(2-phenylpyridine) iridium.

The electron transport layer 126 is an intermediate layer that is composed mainly of an electron transporting material, the electron transport layer being formed on the organic light emitting layer 125 so as to overlie the bank 122 and extend to above the auxiliary wire 131, which will be described later with reference to FIG. 4. The electron transporting material is a material having both a property of being easily converted to anions as having electron acceptor properties and a property of transmitting generated electrons by an inter-molecular charge transfer reaction, and the electron transporting material being appropriate for transport of charges from the transparent cathode 127 to the organic light emitting layer 125. As the electron transport layer 126, for example, a polymer material made of an oxadiazole derivative such as 1,3-bis(4-tert-butylphenyl 1,3,4-oxadiazolyl) phenylene(OXD-7), an anthraquinodimethane derivative, a diphenylquinone derivative or a silole derivative, or bis(2-methyl-8-quinolinolate)-(para-phenylphenolate)aluminum (BAlq), bathocuproin (BCP), or the like can be used.

The electron transport layer 126 that extends to above the auxiliary wire 131 and the electron transport layer 126 that is provided on the anode 121 do not need to be continuous. The electron transport layer 126 that is not continuous can be, for example, an electron transport layer 126 that can form a light emitting portion and a connecting portion in an isolated manner in the same film forming process without the use of a continuous highly accurate mask, and for example, the light emitting portion and the connecting portion are formed in an isolated manner by the bank 122 at the time of film formation by coating.

The transparent cathode 127 is a second electrode that is formed on the electron transport layer 126 so as to overlie the bank 122 and extend to above the auxiliary wire 131, which will be described later with reference to FIG. 3, the transparent cathode being formed entirely so as to cover all pixels 20 and being a transparent electrode that is provided continuously over the pixels 20. There is no particular limitation on the transparent cathode 127, but in the case of a top emission type display device, it is preferable to use a thin film made of a metal such as indium tin oxide, indium zinc oxide, magnesium, aluminum or silver.

An electron injection layer may be formed between the electron transport layer 126 and the transparent cathode 127. Here, the electron injection layer is a layer composed mainly of an electron injecting material. As used herein, the electron injecting material is a material that has a function of injecting electrons injected from the transparent cathode 127 into the organic light emitting layer 125 in a stable manner or while assisting in the generation of electrons.

With the configuration described above, the display unit emits, from the transparent cathode 127 side, light generated by recombination of the electrons and the positive holes injected into the organic light emitting layer 125.

Also, as shown in FIG. 2, the pixel 20 includes the connecting portion 20C that is a region that is adjacent to the sub-pixel 20R and in which the auxiliary wire 131 is disposed between the sub-pixel 20R and a sub-pixel included in another pixel 20. The auxiliary wire 131 is formed on the drive circuit layer 11 so as to be spaced apart from the anode 121. On the auxiliary wire 131, the electron transport layer 126 and the transparent cathode 127 that extend from above the anode 121 are formed.

That is, in the display unit 2 according to the present embodiment, the anode 121 and the organic light emitting layer 125 are spacedly provided in each sub-pixel, and the auxiliary wire 131 is disposed for each pixel column. With this configuration, the wire resistance that is dependent on the distance from the power feeding line 30 is reduced to suppress variations in the pixel drive voltage, and it is therefore possible to implement a color display device having a high quality of display.

The auxiliary wire 131 may be disposed for each pixel row, rather than for each pixel column. Alternatively, the auxiliary wire 131 may be disposed both for each pixel column and for each pixel row. Furthermore, the auxiliary wire 131 may be disposed at least for each sub-pixel column or each row of sub-pixels.

With the stack structure of the auxiliary wire 131, the electron transport layer 126 and the transparent cathode 127 shown in FIG. 4, a pixel current $I_{pix}$ flowing from the driving transistor of the drive circuit layer 11 to the transparent cathode 127 via the anode 121, the positive hole injection layer 123, the positive hole transport layer 124, the organic light emitting layer 125 and the electron transport layer 126 further flows into the electron transport layer 126, which is provided on the auxiliary wire 131, and the auxiliary wire 131.

There is no particular limitation on the auxiliary wire 131, but it is preferable that the auxiliary wire 131 is made of the same material as that of the anode 121 because the auxiliary wire 131 is formed in a process that is performed simultaneously to the formation of the anode 121.

The intermediate layer sandwiched between the auxiliary wire 131 and the transparent cathode 127 shown in FIG. 4 is not limited to the electron transport layer 126. The intermediate layer provided between the auxiliary wire 131 and the transparent cathode 127 may be configured to include at least one of the positive hole injection layer 123, the positive hole transport layer 124, the organic light emitting layer 125, the electron transport layer 126 and the electron injection layer (not shown in the diagram). However, in this case, the intermediate layer is required to have a layer configuration that does not block a flow of the pixel current $I_{pix}$ in a direction in which the pixel current $I_{pix}$ flows.

[Configuration of Pixel Circuit]

Figure 5:
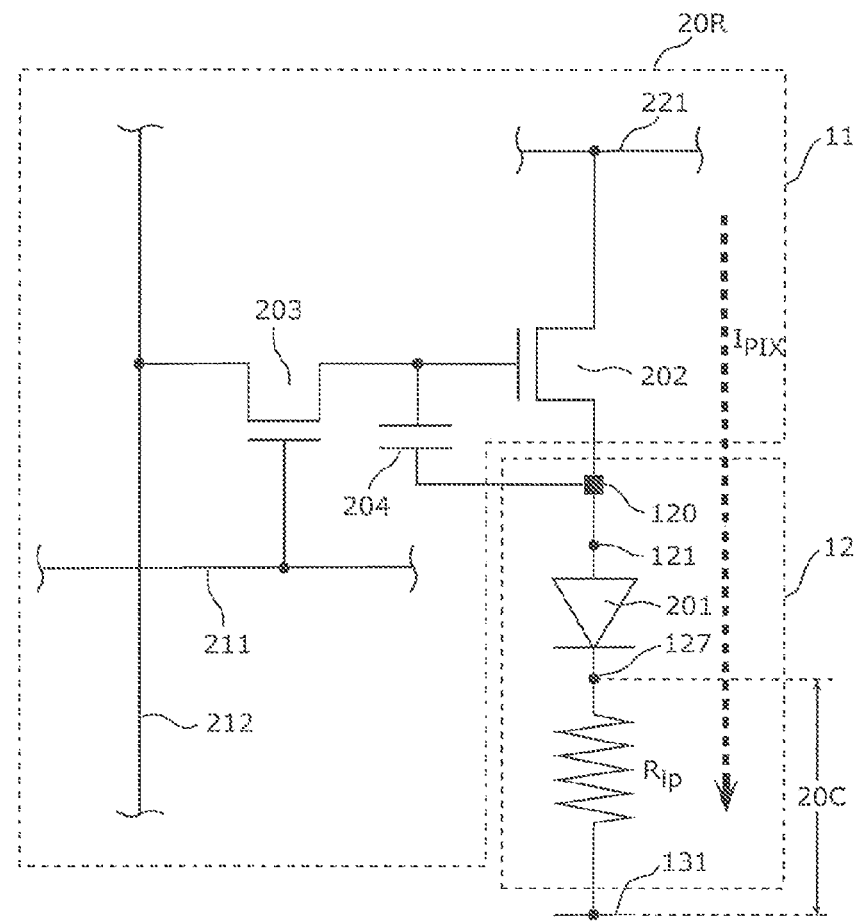
FIG. 5 is a diagram showing an example of a circuit configuration of a pixel according to the embodiment.

FIG. 5 is a diagram showing an example of a circuit configuration of a pixel according to the embodiment. The sub-pixel 20R shown in the diagram includes an organic EL element 201, a data line 212, a scan line 211, a switching transistor 203, a driving transistor 202 and a storage capacitor element 204. The sub-pixel 20G and the sub-pixel 20B also have the same circuit configuration as the sub-pixel 20R. The pixels 20, each including the sub-pixel 20G, the sub-pixel 20B and the sub-pixel 20R, are arranged in a matrix in the display unit.

The switching transistor 203 is, for example, an n-type TFT in which one of the source and the drain is connected to the data line 212, and the other one of the source and the drain is connected to the gate of the driving transistor 202 and one end of the storage capacitor element 204.

The driving transistor 202 is, for example, an n-type TFT whose drain is connected to a positive power supply wire 221, whose source is connected to the anode of the organic EL element 201, and whose gate is connected to one end of the storage capacitor element 204. With this configuration, the driving transistor 202 supplies, to the organic EL element 201, a current corresponding to the voltage stored in the storage capacitor element 204.

The storage capacitor element 204 has another end that is connected to the source of the driving transistor 202, and stores therein a voltage corresponding to the data voltage supplied from the data line 212.

The data line 212 connects the data line drive circuit (not shown in the diagram) to one of the source and the drain of the switching transistor 203, and the data voltage corresponding to the video signal is applied by the data line drive circuit.

The scan line 211 connects the scan line drive circuit 50 to the gate of the switching transistor 203 so as to switch the switching transistor 203 between a conducting state and a non-conducting state according to the voltage applied by the scan line drive circuit 50.

The organic EL element 201 is a light emitting element formed on the organic EL layer 12, and its anode (anode 121) is connected to the source of the driving transistor 202 via the via hole 120, and its cathode (transparent cathode 127) is connected to the auxiliary wire 131 via the intermediate layer (electron transport layer 126). With this connection configuration, the organic EL element 201 emits light at a brightness level corresponding to the current value of the current flowing between the anode and the cathode. Here, the transparent cathode 127, which is the cathode electrode of the organic EL element 201, is provided throughout all pixels 20, and is electrically connected to the power supply unit 3 via the power feeding line 30 such that a negative power supply voltage $V_{EL}$ is applied from the power feeding line 30 provided in the outer periphery region of the display unit 2.

The power supply voltage supplied by the power supply unit 3 includes a positive power supply voltage $V_{DD}$ supplied to the drain of the driving transistor 202 and the negative power supply voltage $V_{EL}$ supplied to the cathode of the organic EL element 201. The anode 121 to which the drain of the driving transistor 202 is connected and the positive power supply wire 221 receive a supply of the positive power supply voltage $V_{DD}$ from the power supply unit 3 via the power feeding line 30 (positive voltage power feeding line). On the other hand, the transparent cathode 127, which is the cathode of the organic EL element 201, receives a supply of the negative power supply voltage $V_{EL}$ from the power supply unit 3 via the auxiliary wire 131 and the power feeding line 30 (negative voltage power feeding line). Here, the power supply voltage supplied by the power supply unit 3 is defined as the positive power supply voltage $V_{DD}$ and the negative power supply voltage $V_{EL}$, but the positive power supply voltage $V_{DD}$ means a voltage having a potential higher than the negative power supply voltage $V_{EL}$, and the negative power supply voltage $V_{EL}$ means a voltage having a potential lower than the positive power supply voltage $V_{DD}$. That is, the positive power supply voltage $V_{DD}$ and the negative power supply voltage $V_{EL}$ do not need to have a positive voltage value and a negative voltage value, respectively.

Here, with the pixel circuit configuration according to the present embodiment, a resistor $R_{ip}$ of the intermediate layer that is composed of the electron transport layer 126 is provided in series between the cathode of the organic EL element 201 and the auxiliary wire 131.

[Configuration for Reducing Voltage Drop]

Hereinafter, the configuration of the intermediate layer, which is an important part of the present invention, will be described.

Figure 6:
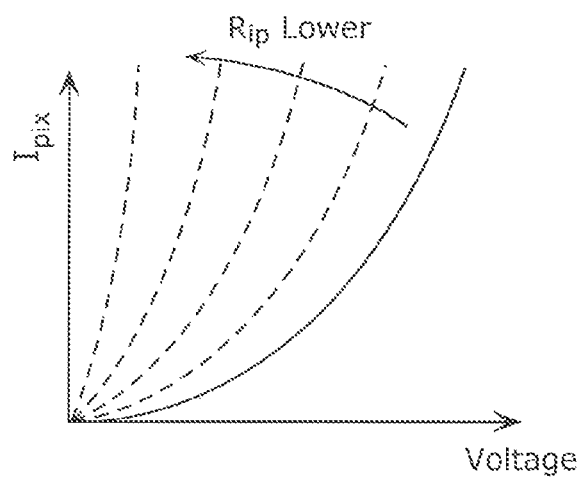
FIG. 6 is a graph showing current-voltage characteristics of a connecting portion of the display device according to the embodiment.

FIG. 6 is a graph showing current-voltage characteristics of the connecting portion of the display device according to the embodiment. In the diagram, the horizontal axis indicates the voltage of the connecting portion 20C shown in FIGS. 4 and 5, and the vertical axis indicates the pixel current $I_{pix}$ flowing through the sub-pixel. As used herein, the voltage of the connecting portion 20C refers to a voltage applied between the auxiliary wire 131 and the transparent cathode 127.

In the present embodiment, the intermediate layer disposed between the auxiliary wire 131 and the transparent cathode 127 is the electron transport layer 126, and is made of, for example, an organic semiconductor. Accordingly, the current-voltage characteristics of the connecting portion 20C are non-linear. Here, the smaller the resistor $R_{ip}$ of the intermediate layer in the connecting portion 20C, the closer the current-voltage characteristics approach to the current axis. That is, the smaller the resistor $R_{ip}$ of the intermediate layer, the smaller the amount of voltage drop in the connecting portion 20C becomes, which increases the effect obtained by disposing the auxiliary wire 131. The resistor $R_{ip}$ of the intermediate layer is configured to include, in addition to the resistance value of the intermediate layer itself, a contact resistance (interfacial resistance) value between the intermediate layer and the transparent cathode 127 and a contact resistance (interfacial resistance) value between the intermediate layer and the auxiliary wire 131.

From this viewpoint, in order to maximize the effect of reducing in the amount of voltage drop obtained by disposing the auxiliary wire 131, it is preferable that the intermediate layer is not provided in the connecting portion 20C. However, along with a trend toward larger and higher resolution screens for display panels, forming functional layers, which are stacked on, above and below the organic light emitting layer 125, in light emitting portions such as sub-pixels without forming the functional layers in the connecting portion 20C requires a highly accurate film forming mask and a complicated process.

In contrast, the present embodiment has a configuration that reduces the amount of voltage drop by a simplified production process without requiring a highly accurate film forming mask and a complicated process. Hereinafter, a description will be given of electric and physical features of the intermediate layer for solving the problem of brightness nonuniformity while ensuring the light emitting characteristics of the display unit 2 without requiring the use of a highly accurate film forming mask and a complicated process.

Figure 7:
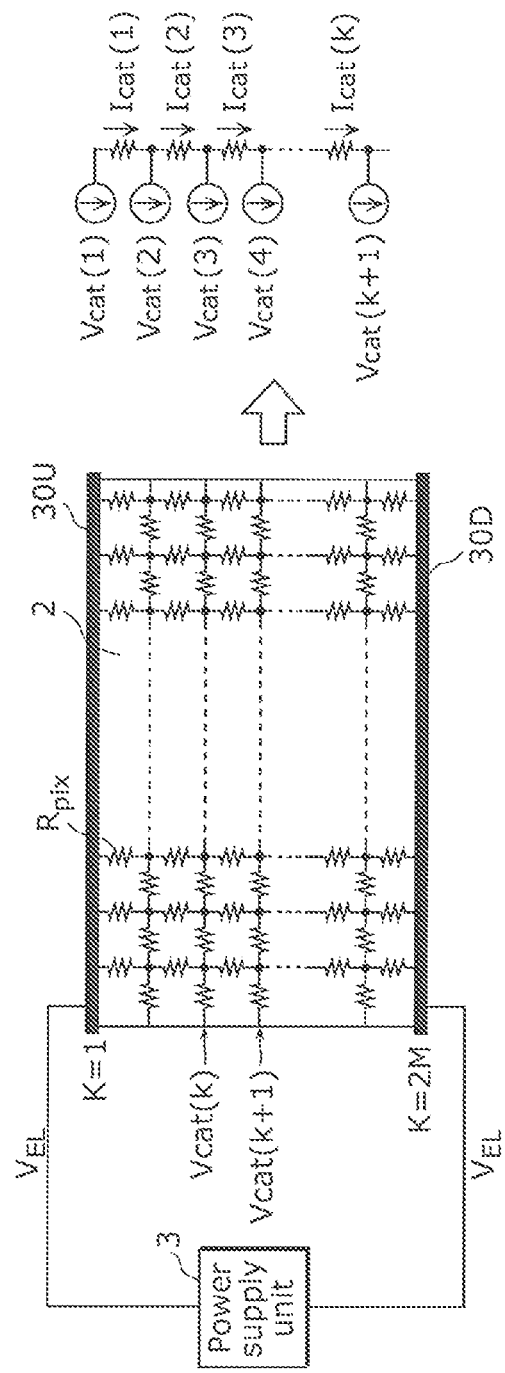
FIG. 7 is a diagram showing a display unit in which a transparent cathode is modeled as a resistance wire network.

FIG. 7 is a diagram showing a display unit in which a transparent cathode is modeled as a resistance wire network. In the diagram, only the transparent cathode 127 is modeled as a resistance wire network without modeling the anode 121. As shown in the diagram, the transparent cathode 127 formed continuously over the display unit 2 is subdivided into resistance components $R_{PIX}$ for pixels.

Also, the display unit 2 according to the present embodiment may have, for example, a significant difference in size between length and width (length:width=9:16). In this case, even when the power supply voltage is fed from all four sides of the outer periphery of the display unit 2 during raster display, for example, a center pixel of the display unit 2 does not receive any effect obtained by feeding power from the left and right sides of the outer periphery, which is therefore equivalent to receiving power from only the top and bottom sides of the outer periphery. From this viewpoint, in this resistance wire network model, the power feeding line 30 on the negative voltage side that is disposed on the outer periphery region of the display unit 2 is configured to include a negative voltage power feeding line 30U disposed in an upper portion of the outer periphery region of the display unit 2 and a negative voltage power feeding line 30D disposed in a lower portion of the outer periphery region of the display unit 2. With this model, the cathode voltage $V_{EL}$ to be applied to the cathode of the organic EL element 201 is applied to each pixel 20 of the display unit 2 via the negative voltage power feeding lines 30U and 30D. Here, it is assumed here that the display unit 2 includes 2M rows.

As described above, in the case where the cathode voltage $V_{EL}$ is fed from the negative voltage power feeding lines 30U and 30D, the model for calculating the amount of voltage drop in the cathode voltage $V_{EL}$ in each pixel can be replaced by the model shown on the right side of FIG. 7. In this model, $V_{cat}(k)$ represents the cathode voltage of the organic EL elements 201 in a pixel 20 on the kth row, and $I_{cat}(k)$ represents a current flowing through the auxiliary wires 131 of the pixel 20 on the kth row.

Here, a current $I_{cat}(M)$ flowing through the auxiliary wire 131 of a pixel that is located farthest from the negative voltage power feeding lines 30U and 30D, or in other words, a pixel 20 in the Mth row, which is the center pixel row, is equal to the pixel current $I_{pix}$ flowing through the driving transistors 202 and the organic EL elements 201 of the pixel 20. Also, a current $I_{cat}(M-1)$ flowing through the auxiliary wire 131 of a pixel 20 in the (M−1)th row is equal to an added current $2 \times I_{PIX}$ obtained from the pixel current $I_{pix}$ of the pixel 20 and the pixel current $I_{pix}$ of the pixel 20 in the Mth row if all rows simultaneously emit uniform light. Likewise, a current $I_{cat}(k)$ flowing through the auxiliary wire 131 of a pixel 20 in the (M−k)th row is equal to an added current $(k+1) \times I_{PIX}$ obtained from the pixel current $I_{pix}$ of the pixel 20 and the pixel current $I_{pix}$ of the pixel 20 in each of the Mth to (M−(k−1))th rows if all rows simultaneously emit uniform light. The above relationship is represented by Equation 1 given below.

[Math. 1]

$$I_{cat}(M) = 1 \cdot I_{PIX}$$

$$I_{cat}(M-1) = 2 \cdot I_{PIX}$$

$$I_{cat}(M-k) = (k+1) \cdot I_{PIX} \quad \text{(Equation 1)}$$

At this time, the amount of voltage drop that occurs in the pixel 20 in the Mth row is represented by $V_{cat}(M) - V_{cat}(M-1)$, and the amount of voltage drop that occurs in the pixel 20 in the (M−k)th row is represented by $V_{cat}(M-k) - V_{cat}(M-(k+1))$. Here, the amount of voltage drop that occurs in the pixel 20 in the (M−k)th row is equal to a product obtained by multiplying the resistance component $R_{PIX}$ by a current $I_{cat}(M-k)$ flowing through the auxiliary wires 131 of the pixel 20 in the (M−k)th row. Accordingly, the amount of voltage drop that occurs in the pixel 20 in the (M−k)th row is represented by Equation 2 given below.

[Math. 2]

$$V_{cat}(M) - V_{cat}(M-1) = R_{PIX} \cdot I_{cat}(M) = R_{PIX} \cdot 1 I_{PIX}$$

$$V_{cat}(M-1) - V_{cat}(M-2) = R_{PIX} \cdot I_{cat}(M-1) = R_{PIX} \cdot 2 I_{PIX}$$

$$V_{cat}(M-k) - V_{cat}(M-(k+1)) = R_{PIX} \cdot I_{cat}(M-k) = R_{PIX} \cdot (k+1) I_{PIX} \quad \text{(Equation 2)}$$

From Equation 2 given above, the amount of voltage drop $V_{cat}(M)$ of the voltage from the negative voltage power feeding lines 30U and 30D in the pixels located farthest from the negative voltage power feeding lines 30U and 30D, or in other words, the pixel 20 in the Mth row, which is the center pixel row, is represented by Equation 3 given below.

[Math. 3]

$$V_{cat}(M) = \sum_{k=1}^{M-1} [V_{cat}(M-k) - V_{cat}(M-(k+1))] = R_{PIX} I_{PIX} \sum_{k=1}^{M} k = R_{PIX} I_{PIX} \frac{M(M+1)}{2} \quad \text{(Equation 3)}$$

Here, in the present embodiment, in the pixel 20 in the Mth row that are located farthest from the negative voltage power feeding lines 30U and 30D, an amount of voltage drop $V_{Bcat}$ when the negative power supply voltage of the power supply unit 3 is transmitted from the negative voltage power feeding lines 30U and 30D via the connecting portion 20C is less than or equal to an amount of voltage drop $V_{Dcat}$ when the negative power supply voltage is transmitted via transparent cathode 127 without passing through the connecting portion 20C. This relationship is represented by Equation 4 given below.

[Math. 4]

$$V_{Dcat} \geq V_{Bcat} = V_B + V_{ip} \quad \text{(Equation 4)}$$

In Equation 4 given above, $V_B$ represents the amount of voltage drop of the auxiliary wire 131 disposed between the negative voltage power feeding line 30U or 30D and the pixel 20 in the Mth row, and $V_{ip}$ represents the amount of voltage drop between the auxiliary wire 131 and the transparent cathode 127 in the pixel 20 in the Mth row.

Here, for the amounts of voltage drop $V_{Dcat}$ and $V_{Bcat}$ shown in Equation 4 given above, Equation 3 given above is applied by replacing $R_{PIX}$ in the power supply wire network model shown in FIG. 7 by a resistance $R_{2P}$ of the transparent cathode 127 per pixel and a resistance Rep of the auxiliary wire 131 per pixel, respectively. Also, $V_{ip}$ is obtained by multiplying the resistor $R_{ip}$ of the intermediate layer by the pixel current $I_{pix}$, and thus Equation 4 given above is represented by Equation 5 given below.

[Math. 5]

$$R_{2P} I_{PIX} \frac{M(M+1)}{2} \geq R_{BP} I_{PIX} \frac{M(M+1)}{2} + R_{ip} I_{PIX} \quad \text{(Equation 5)}$$

As a result of Equation 5 given above being developed, Equation 6 given below is obtained.

[Math. 6]

$$R_{ip} \leq (R_{2P} - R_{BP}) \frac{M(M+1)}{2} \quad \text{(Equation 6)}$$

Equation 6 given above shows that the resistance value of the electron transport layer 126 (intermediate layer) per pixel is defined by the above relational equation expressed by the resistance value $R_{2P}$ of the transparent cathode 127 per pixel, the resistance $R_{BP}$ of the auxiliary wire 131 per pixel, and the Mth pixel row located farthest from the power feeding line 30. By setting the intermediate layer with Equation 6 given above, even in the pixel located farthest from the power feeding line 30 in the display unit 2, the amount of voltage drop can be reduced as compared to the conventional display unit configuration that does not include an auxiliary wire. Accordingly, it is possible to implement a display device 1 having a high quality of display in which brightness variations between pixels caused by a voltage drop are reduced significantly by a reduction in the wire resistance between the power feeding line 30 and each pixel even when the display device is used as a large-format panel. Also, the electron transport layer 126 provided between the organic light emitting layer 125 and the transparent cathode 127 is extended between the auxiliary wire 131 and the transparent cathode 127, and thus the production process can be simplified, and the productivity can be improved.

Also, in the present embodiment, the intermediate layer is defined not only by using the resistance values as described above, but also by using a contact area $S_{ip}$ and a thickness $I_i$ of the intermediate layer as described below.

Here, a current density $J_{PIX}$ of a current flowing through the intermediate layer, or in other words, a pixel current is represented by Equation 7 given below, where the current flowing through the connecting portion 20C is based on a space charge limited current, the dielectric constant of the intermediate layer is represented by $\in$, and the mobility of the intermediate layer is represented by $\mu$.

[Math. 7]

$$J_{PIX} = \frac{9}{8}\varepsilon\mu\frac{V_{ip}^2}{l_i^3} \quad \text{(Equation 7)}$$

Also, Equations 8 and 9 given below are established.

[Math. 8]

$$I_{PIX} = J_{PIX} \cdot S_{ip} \quad \text{(Equation 8)}$$

[Math. 9]

$$R_{ip} = \frac{V_{ip}}{I_{PIX}} = \sqrt{\frac{8l_i^3}{9\varepsilon\mu \cdot I_{PIX} \cdot S_{ip}}} \quad \text{(Equation 9)}$$

Equation 10 given below is obtained by substituting Equation 9 given above into Equation 6 given above.

[Math. 10]

$$\frac{8}{9I_{PIX} \cdot S_{ip}}\left[\frac{1}{R_{2P} - R_{BP}} \cdot \frac{2}{M(M+1)}\right]^2 \leq \frac{\varepsilon\mu}{l_i^3} \quad \text{(Equation 10)}$$

Equation 10 given above shows that the contact area and the thickness of the electron transport layer 126 (intermediate layer) in the connecting portion 20C and the dielectric constant $\in$ and the mobility $\mu$ of the electron transport layer 126 (intermediate layer) are defined by the above relational equation expressed by the resistance value $R_{2P}$ of the transparent cathode 127 per pixel, the resistance $R_{BP}$ of the auxiliary wire 131 per pixel, the pixel current $I_{pix}$, and the Mth pixel row located farthest from the power feeding line 30. By setting the intermediate layer with Equation 10 given above, even in a pixel located farthest from the power feeding line 30 in the display unit 2, the amount of voltage drop can be effectively suppressed as compared to a conventional display unit configuration that does not include an auxiliary wire.

In pixels 20 near the negative voltage power feeding line 30U, 30D, the amount of voltage drop $V_{Bcat}$ when the negative power supply voltage of the power supply unit 3 is transmitted from the negative voltage power feeding lines 30U and 30D via the connecting portion 20C may be greater than the amount of voltage drop $V_{Dcat}$ when the negative power supply voltage is transmitted via the transparent cathode 127 without passing through the connecting portion 20C. This relationship is represented by Equation 11 given below.

[Math. 11]

$$V_{Dcat} < V_{Bcat} = V_B + V_{ip} \quad \text{(Equation 11)}$$

As used herein, the pixels 20 near the negative voltage power feeding line 30U, 30D refers to, for example, where the number of pixel rows in the display unit 2 is represented by 2M, the pixels 20 in the first to (10%×M)th rows, or the pixels 20 in the (190%×M)th to 2Mth rows. Alternatively, the pixels 20 near the negative voltage power feeding line 30U, 30D refers to a pixel in the first row or a pixel 20 in the 2Mth row.

It is assumed here that the pixels 20 near the negative voltage power feeding line 30U, 30D are the pixels in the Nth row from the negative voltage power feeding line 30U, 30D. Also, if Equation 3 given above is applied to Equation 11 by replacing $R_{PIX}$ in the power supply wire network model shown in FIG. 7 by the resistance $R_{2P}$ of the transparent cathode 127 per pixel and the resistance $R_{BP}$ of the auxiliary wire 131 per pixel, respectively, and also replacing M by N, then, Equation 12 given below is obtained.

[Math. 12]

$$R_{ip} > (R_{2P} - R_{BP})\frac{N(N+1)}{2} \quad \text{(Equation 12)}$$

Equation 12 given above shows that the resistance value of the electron transport layer 126 (intermediate layer) per pixel is defined by the above relational equation expressed by the resistance value $R_{2P}$ of the transparent cathode 127 per pixel, the resistance $R_{BP}$ of the auxiliary wire 131 per pixel, and the Nth pixel row near the power feeding line 30.

By setting the intermediate layer with Equation 12 given above, in the pixels near the power feeding line 30 in the display unit 2, the negative power supply voltage is directly fed from the power feeding line 30 to the transparent cathode 127 without passing through the auxiliary wire 131.

That is, as a result of the resistance value $R_{ip}$ of the electron transport layer 126 (intermediate layer) being defined by the relational equation given by Equation 6 and the relational equation given by Equation 12, in the pixels 20 distant from the power feeding line 30, the power transmission by the auxiliary wire 131 is effectively performed, and the negative power supply voltage is fed via the auxiliary wire 131. Accordingly, the amount of voltage drop can be effectively suppressed in the pixels distant from the power feeding line 30 in the display unit 2.

Advantageous Effects, Etc.

As described above, the display device according to one aspect of the present embodiment is a display device 1 including: a display unit 2 in which pixels 20 are arranged in a matrix, the pixels 20 each having an organic EL element 201 and a circuit element for driving the organic EL element 201 to emit light; and a power supply unit 3 that feeds a power supply voltage to the pixels 20 through a power feeding line 30 disposed in an outer periphery region of the display unit 2, wherein the pixels 20 each include: an anode 121 formed on a drive circuit layer 11 on which the circuit element is formed; an auxiliary wire 131 formed on the drive circuit layer 11 to be spaced apart from the anode 121; an organic light emitting layer 125 formed above the anode 121, the organic light emitting layer 125 containing a light emitting substance; a transparent cathode 127 formed above the organic light emitting layer 125; and an electron transport layer 126 provided between the organic light emitting layer 125 and the transparent cathode 127, the electron transport layer 126 being for assisting the transport of electrons to the organic light emitting layer 125. The electron transport layer 126 and the transparent cathode 127 extend from above the anode 121 to above the auxiliary wire 131. The electron transport layer 126 on the auxiliary wire 131 has a resistance value $R_{ip}$ that satisfies the following relationship: $R_{ip} \leq (R_{2p} - R_{bp}) \times M \times (M+1)/2$, where one of the pixels 20 that is located farthest from the power feeding line 30 is defined as a first pixel disposed in a position corresponding to the Mth pixel from the power feeding line 30, a resistance value of the transparent cathode 127 per pixel is represented by $R_{2p}$, and a resistance value of the auxiliary wire 131 per pixel is represented by $R_{bp}$.

With this configuration, even in the pixel located farthest from the power feeding line 30 in the display unit 2, the amount of voltage drop can be reduced as compared to the conventional display unit configuration that does not include an auxiliary wire. Accordingly, it is possible to significantly reduce brightness variations between pixels caused by a voltage drop by a reduction in the wire resistance between the power feeding line 30 and each pixel 20 even when the display device is used as a large-format panel. Also, the electron transport layer 126 provided between the organic light emitting layer 125 and the transparent cathode 127 is extended between the auxiliary wire 131 and the transparent cathode 127, and thus the production process can be simplified, and the productivity can be improved.

Also, the amount of voltage drop when the power supply voltage is transmitted from the power feeding line 30 to the first pixel via the auxiliary wire 131 may be less than or equal to the amount of voltage drop when the power supply voltage is transmitted from the power feeding line 30 to the transparent cathode 127 without passing through the auxiliary wire 131.

With this configuration, in the pixel located farthest from the power feeding line 30 in the display unit 2, the amount of voltage drop can be reduced.

Also, if a pixel 20 near the power feeding line 30 is defined as a second pixel disposed in the Nth pixel from the power feeding line 30, the resistance value $R_{ip}$ of the electron transport layer 126 may further satisfy the following relationship: $R_{ip} > (R_{2p} - R_{bp}) \times N \times (N+1)/2$.

Also, the amount of voltage drop when the power supply voltage is transmitted from the power feeding line 30 to the second pixel via the auxiliary wire 131 may be greater than the amount of voltage drop when the power supply voltage is transmitted from the power feeding line 30 via the transparent cathode 127 without passing through the auxiliary wire 131.

With this configuration, the pixel 20 located distant from the power feeding line 30 receives a supply of the power supply voltage via the auxiliary wire 131. Accordingly, in at least the pixel 20 located distant from the power feeding line 30, the amount of voltage drop can be more effectively suppressed as compared to a configuration in which the auxiliary wire 131 is not disposed.

Also, the intermediate layer provided between the auxiliary wire 131 and the transparent cathode 127 may be at least one of the organic light emitting layer 125, the positive hole injection layer 123, the positive hole transport layer 124, the electron transport layer 126 and the electron injection layer.

With this configuration, it is possible to eliminate the step of forming and isolating the functional layer, which will serve as the intermediate layer, by using a highly accurate mask or the like, and thus the production process can be simplified, and the productivity can be improved.

Also, the anode 121 and the organic light emitting layer 125 may be spacedly provided in each pixel 20, and the auxiliary wire 131 may be disposed at least for each pixel column or each pixel row.

With this configuration, the wire resistance that is dependent on the distance from the power feeding line 30 is reduced to suppress variations in the pixel drive voltage, and a display device having a high quality of display can be implemented.

Also, each pixel 20 may be composed of at least three sub-pixels 20R, 20G and 20B. The anode 121 and the organic light emitting layer 125 may be spacedly provided in each sub-pixel, and the auxiliary wire 131 may be disposed at least for each sub-pixel column or each sub-pixel row.

With this configuration, the wire resistance that is dependent on the distance from the power feeding line 30 is reduced to suppress variations in the pixel drive voltage, and a color display device having a high quality of display can be implemented.

Also, the drive circuit layer 11 may include an interlayer insulating layer 116 disposed under the anode 121 and a driving transistor 202 that is disposed under the interlayer insulating layer 116 and that drives the organic EL element 201. The anode 121 and the source of the driving transistor 202 may be connected via a via hole 120 formed in the interlayer insulating layer 116. The positive voltage terminal of the power supply unit 3 may be connected to the drain of the driving transistor 202 via the power feeding line 30, and the negative voltage terminal of the power supply unit 3 may be connected to the auxiliary wire 131 via the power feeding line 30.

With this configuration, the negative voltage terminal of the power supply unit 3 is connected to the auxiliary wire 131 via the power feeding line 30, and thus the cathode potential of the pixel 20 in the display unit 2 is stabilized, and brightness variations can be reduced.

Other Embodiments

Up to here, the display device according to the present invention has been described by way of an embodiment, but the display device according to the present invention is not limited to the embodiment given above. The present invention also encompasses other embodiments implemented by any combination of the structural elements of the embodiment, variations obtained by making various types of modifications that can be conceived by a person having ordinary skill in the art to the embodiment without departing from the gist of the present invention, and various types of devices incorporating the display device according to the present embodiment.

For example, in the embodiment given above, an example has been described in which the organic EL layer 12 has a configuration of anode/positive hole injection layer/positive hole transport layer/organic light emitting layer/electron transport layer/cathode, but the configuration is not limited thereto. For example, the organic EL layer may include at least an organic light emitting layer, an anode and a cathode. Alternatively, for example, the organic EL layer may include, other than the organic light emitting layer, the anode and the cathode, at least one of a positive hole injection layer, a positive hole transport layer, an electron transport layer and an electron injection layer.

Also, in the embodiment given above, a configuration has been shown, as an example, that reduces the voltage drop (rise) in the negative power supply voltage $V_{EL}$ by the transparent cathode 127 formed continuously in the display unit 2, but depending on the circuit configuration, the light emission scheme, the stack structure of the organic EL layer, and the like, the present invention also encompasses a configuration that reduces, for example, the voltage drop in the positive power supply voltage $V_{DD}$ by the anode 121 in a common anode top emission.

Also, the embodiment given above has been described as each pixel 20 being configured by three sub-pixels 20R, 20G and 20B, but the pixel configuration is not limited thereto. For example, even when the pixel 20 is configured by one pixel without including a plurality of sub-pixels, the same effects as those of the display device 1 according to the embodiment described above can be obtained.

The embodiment given above has been described as the intermediate layer being a part of a layer that constitutes a light emitting portion, but the intermediate layer that constitutes a connecting portion does not need to be continuous with the layer that constitutes a light emitting portion. The intermediate layer may be, for example, an intermediate layer that can form a light emitting portion and a connecting portion in an isolated manner without the use of a highly accurate mask and in which, for example, the light emitting portion and the connecting portion are formed in an isolated manner by the bank 122 at the time of film formation by coating. In this case as well, brightness variations can be reduced while simplifying the production process.

Figure 8:
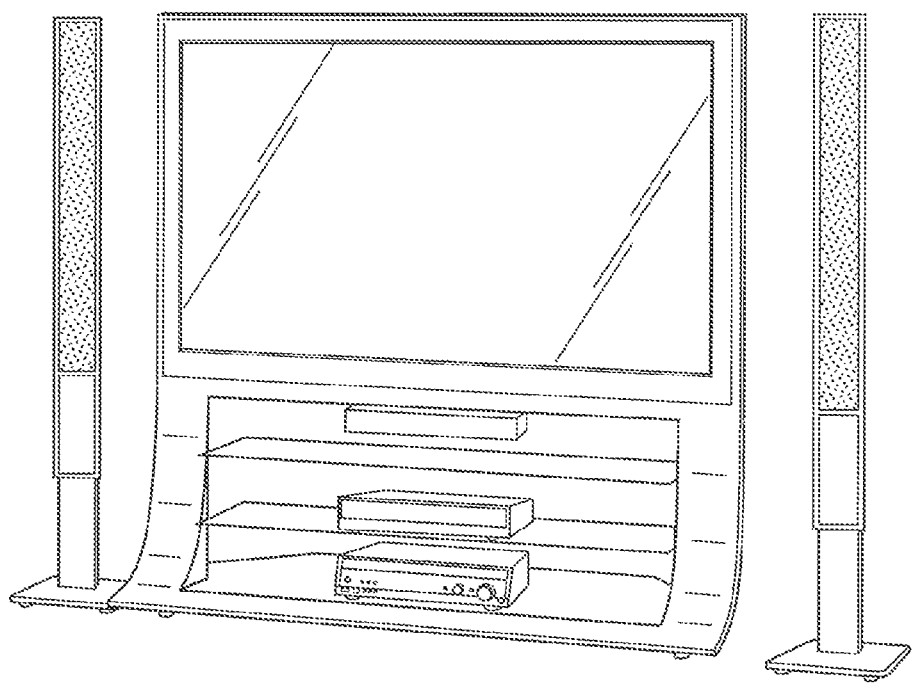
FIG. 8 is an external view of a thin flat-screen television set incorporating the display device according to the embodiment.

Also, for example, the display device 1 according to the present embodiment is incorporated in a thin flat-screen television set as shown in FIG. 8. As a result of incorporation of the display device 1 according to the present embodiment, it is possible to achieve a high-quality thin flat-screen television set in which brightness variations are significantly reduced while simplifying the production process.

INDUSTRIAL APPLICABILITY

The present invention is useful for an organic EL flat panel display, and is most suitable for use as a display required to have uniformity in image quality.

The invention claimed is:

1. A display device comprising: a display unit in which pixels are arranged in a matrix, the pixels each including a light emitting element and a circuit element for driving the light emitting element to emit light; and a power supply unit configured to feed a power supply voltage to the pixels through a power feeding line disposed in an outer periphery region of the display unit,
    wherein the pixels each include:
        a first electrode formed on a drive circuit substrate on which the circuit element is formed;
        an auxiliary wire formed on the drive circuit substrate to be spaced apart from the first electrode;
        a light emitting layer formed above the first electrode, the light emitting layer containing a light emitting substance;
        a second electrode formed above the light emitting layer; and
        an intermediate layer provided between the first electrode and the second electrode,
    the intermediate layer and the second electrode extend from above the first electrode to above the auxiliary wire, and the intermediate layer on the auxiliary wire has a resistance value $R_{ip}$ that satisfies the following relationship:
$R_{ip} \leq (R_{2p} - R_{bp}) \times M \times (M+1)/2$, where one of the pixels that is located farthest from the power feeding line is defined as a first pixel disposed in a position corresponding to an Mth pixel from the power feeding line, a resistance value of the second electrode per pixel is represented by $R_{2p}$, and a resistance value of the auxiliary wire per pixel is represented by $R_{bp}$.

2. The display device according to claim 1,
    wherein an amount of voltage drop when the power supply voltage is transmitted from the power feeding line to the first pixel via the auxiliary wire is less than or equal to an amount of voltage drop when the power supply voltage is transmitted from the power feeding line via the second electrode without passing through the auxiliary wire.

3. The display device according to claim 1,
    wherein the resistance value $R_{ip}$ of the intermediate layer further satisfies the following relationship:
    $R_{ip} > (R_{2p} - R_{bp}) \times N \times (N+1)/2$, where one of the pixels that is located near the power feeding line is defined as a second pixel disposed in a position corresponding to an Nth pixel from the power feeding line.

4. The display device according to claim 3,
    wherein an amount of voltage drop when the power supply voltage is transmitted from the power feeding line to the second pixel via the auxiliary wire is greater than an amount of voltage drop when the power supply voltage is transmitted from the power feeding line via the second electrode without passing through the auxiliary wire.

5. The display device according to claim 1,
    wherein the light emitting element is an organic electroluminescent (EL) element, and
    the intermediate layer is at least one of the light emitting layer, a positive hole transport layer that assists in transport of positive holes to the light emitting layer, a positive hole injection layer that injects the positive holes to the light emitting layer, an electron transport layer that assists in transport of electrons to the light emitting layer, and an electron injection layer that injects the electrons to the light emitting layer.

6. The display device according to claim 1,
    wherein the first electrode and the light emitting layer are spacedly provided in each of the pixels, and
    the auxiliary wire is disposed at least for each pixel column or each pixel row.

7. The display device according to claim 6,
    wherein the pixels each include at least three sub-pixels,
    the first electrode and the light emitting layer are spacedly provided in each of the sub-pixels, and
    the auxiliary wire is disposed at least for each column of the sub-pixels or each row of the sub-pixels.

8. The display device according to claim 1,
    wherein the drive circuit substrate includes:
        an interlayer insulating layer disposed below the first electrode; and
        a driving transistor that is disposed below the interlayer insulating layer and that drives the light emitting element including the light emitting layer, the first electrode, the second electrode, and the intermediate layer,
    the first electrode is connected to one of a source and a drain of the driving transistor via a conductive via hole formed in the interlayer insulating layer, and one terminal of the power supply unit is connected to the other one of the source and the drain of the driving transistor via the power feeding line, and another terminal of the power supply unit is connected to the auxiliary wire via the power feeding line.

* * * * *